(12) United States Patent
Tang et al.

(10) Patent No.: US 10,607,898 B2
(45) Date of Patent: Mar. 31, 2020

(54) TUNNEL MAGNETORESISTIVE EFFECT ELEMENT, MAGNETIC MEMORY, AND BUILT-IN MEMORY

(71) Applicant: TDK CORPORATION, Tokyo (JP)

(72) Inventors: Zhenyao Tang, Tokyo (JP); Tomoyuki Sasaki, Tokyo (JP)

(73) Assignee: TDK CORPORATION, Tokyo (JP)

(*) Notice: Subject to any disclaimer, the term of this patent is extended or adjusted under 35 U.S.C. 154(b) by 14 days.

(21) Appl. No.: 16/082,914

(22) PCT Filed: Nov. 8, 2017

(86) PCT No.: PCT/JP2017/040293
§ 371 (c)(1),
(2) Date: Sep. 6, 2018

(87) PCT Pub. No.: WO2019/092816
PCT Pub. Date: May 16, 2019

(65) Prior Publication Data
US 2019/0279907 A1    Sep. 12, 2019

(51) Int. Cl.
*H01L 27/108* (2006.01)
*H01L 21/8239* (2006.01)
*G01R 33/09* (2006.01)
*H01L 27/105* (2006.01)
*H01L 27/22* (2006.01)
(Continued)

(52) U.S. Cl.
CPC ........ *H01L 21/8239* (2013.01); *G01R 33/093* (2013.01); *G01R 33/098* (2013.01); *H01L 27/105* (2013.01); *H01L 27/228* (2013.01); *H01L 43/08* (2013.01); *H01L 43/10* (2013.01)

(58) Field of Classification Search
CPC .................................................. H01L 21/8239
USPC ......................................................... 257/296
See application file for complete search history.

(56) References Cited

U.S. PATENT DOCUMENTS

| 8,994,131 B2 | 3/2015 | Shimomura et al. |
| 2010/0102406 A1 | 4/2010 | Xi et al. |
| 2011/0180888 A1 | 7/2011 | Xi et al. |

(Continued)

FOREIGN PATENT DOCUMENTS

| JP | 4775616 B2 | 9/2011 |
| JP | 5586028 B2 | 9/2014 |

(Continued)

OTHER PUBLICATIONS

Shinji Miwa et al., "Spin-Dependent Transport in C60-Co Nano-Composites", Japanese Journal of Applied Physics, vol. 45, No. 28, 2006, pp. L717-L719.

(Continued)

*Primary Examiner* — Ajay Arora
(74) *Attorney, Agent, or Firm* — Oliff PLC

(57) ABSTRACT

A TMR element includes a magnetic tunnel junction, a side wall portion that covers a side surface of the magnetic tunnel junction, and a minute particle region that is disposed in the side wall portion. The side wall portion includes an insulation material. The minute particle region includes the insulation material and a plurality of minute magnetic metal particles that are dispersed in the insulation material. The minute particle region is electrically connected in parallel with the magnetic tunnel junction.

20 Claims, 11 Drawing Sheets

(51) Int. Cl.
*H01L 43/08* (2006.01)
*H01L 43/10* (2006.01)

(56) References Cited

U.S. PATENT DOCUMENTS

| | | | |
|---|---|---|---|
| 2012/0070693 A1* | 3/2012 | Abarra | B82Y 10/00 428/811.2 |
| 2012/0091548 A1 | 4/2012 | Sukegawa et al. | |
| 2013/0221461 A1 | 8/2013 | Sukegawa et al. | |
| 2018/0240845 A1* | 8/2018 | Yang | G11C 11/1659 |

FOREIGN PATENT DOCUMENTS

| | | | |
|---|---|---|---|
| JP | 2015-156501 A | 8/2015 | |
| JP | 5988019 B2 | 9/2016 | |

OTHER PUBLICATIONS

D.C. Ralph et al.; "Spin transfer torques", Journal of Magnetism and Magnetic Materials, vol. 320, Issue 7, 2008, pp. 1190-1216.
J. Chiba et al.; "STM observation of metal-nonmetal granular thin films", J. Magn., Soc. Japan, vol. 23, No. 1-2, 1999, pp. 82-84.

* cited by examiner

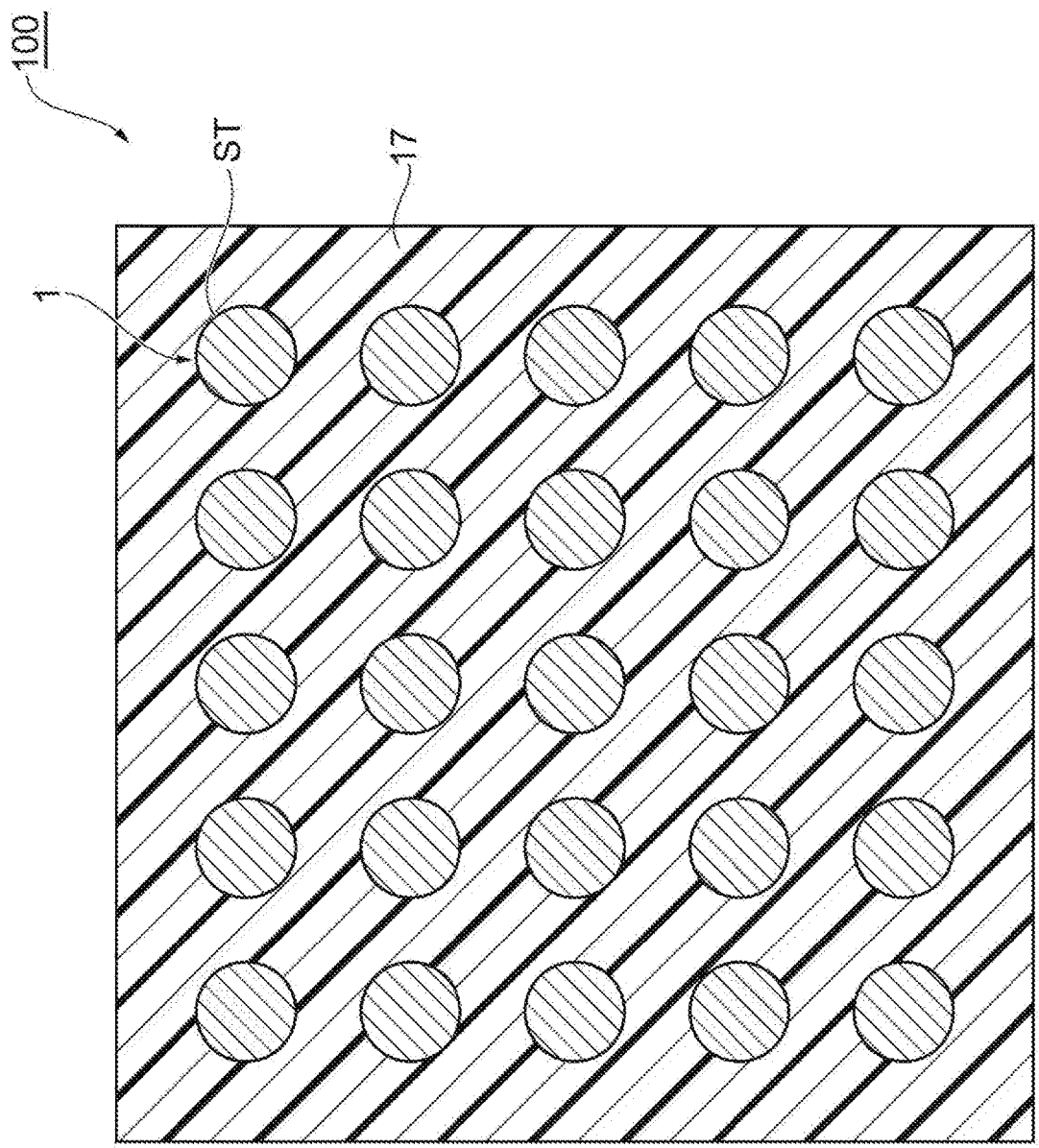
Fig.1
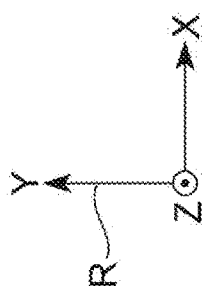

Fig.5
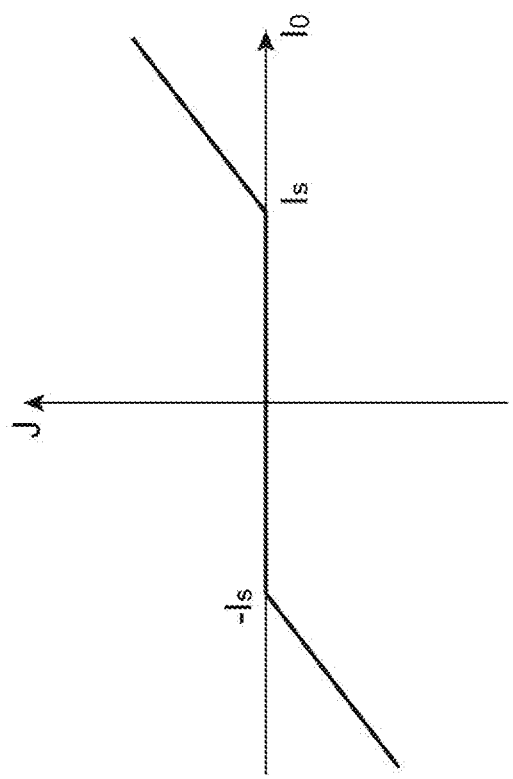
(a)
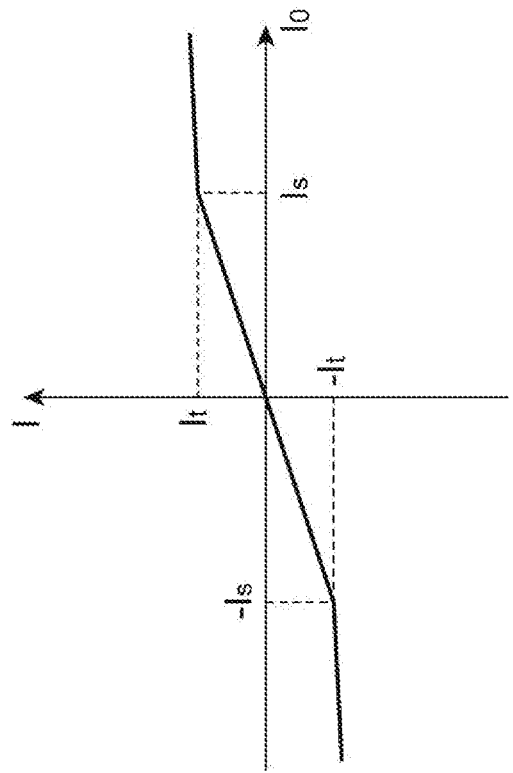
(b)

TUNNEL MAGNETORESISTIVE EFFECT ELEMENT, MAGNETIC MEMORY, AND BUILT-IN MEMORY

TECHNICAL FIELD

The present disclosure relates to a tunnel magnetoresistive effect element, a magnetic memory, and a built-in memory.

BACKGROUND ART

Magnetoresistive effect elements such as a giant magnetoresistive effect (GMR) element and a tunnel magnetoresistive effect (TMR) element having a configuration in which a reference layer as a magnetization fixed layer, a non-magnetic spacer layer, and a magnetization free layer are stacked in this order are known. Among the magnetoresistive effect elements, the TMR element that uses an insulation layer (tunnel barrier layer) as the non-magnetic spacer layer generally has high element resistance but can realize high magnetoresistance (MR ratio), compared to the GMR element that uses a conductive layer as the non-magnetic spacer layer. Thus, the TMR element has drawn attention as an element used in a magnetic sensor, a magnetic head, a magnetoresistive random access memory (MRAM), and the like (for example, Patent Literatures 1 and 2 below).

A technology called "spin injection magnetization reversal" in which a spin transfer torque (STT) is applied to the magnetization free layer from electron spins by causing a spin-polarized current to flow through the magnetization free layer is known as a method of reversing the magnetization direction of the magnetization free layer of the TMR element (for example, Patent Literatures 3 and 4 below). When the STT technology is used in the TMR element, an interconnect for magnetic field generation for reversing the magnetization direction of the magnetization free layer is not necessary. In addition, the magnetization of the magnetization free layer can be efficiently reversed from the viewpoint of electrical energy.

CITATION LIST

Patent Literature

[Patent Literature 1] Japanese Patent No. 5586028
[Patent Literature 2] Japanese Patent No. 5988019
[Patent Literature 3] Japanese Unexamined Patent Publication No. 2015-156501
[Patent Literature 4] U.S. Pat. No. 8,994,131

SUMMARY

However, in the reversal of magnetization using the STT technology in the TMR element, the density of a reversal current for reversing magnetization in the TMR element is high. Thus, an excessive current may be input into the magnetic tunnel junction. The input of the excessive current particularly degrades the tunnel barrier layer in the magnetic tunnel junction. Consequently, the reliability of the TMR element may be decreased. In order to improve the reliability of the TMR element, it is desirable to dispose a configuration that can suppress the input of the excessive current into the magnetic tunnel junction in the TMR element.

The present disclosure is conceived in view of the above problem. An object of the present disclosure is to provide a TMR element that can suppress input of an excessive current into a magnetic tunnel junction. In addition, an object of the present disclosure is to provide a magnetic memory that includes the TMR element, and a built-in memory that includes the magnetic memory.

In order to resolve the above problem, a tunnel magnetoresistive effect (TMR) element according to one aspect of the present disclosure includes a magnetic tunnel junction, a side wall portion that covers a side surface of the magnetic tunnel junction, and a minute particle region that is disposed in the side wall portion. The side wall portion includes an insulation material. The minute particle region includes the insulation material and minute magnetic metal particles that are dispersed in the insulation material. The minute particle region is electrically connected in parallel with the magnetic tunnel junction.

In the TMR element according to one aspect of the present disclosure, in the minute particle region, the minute magnetic metal particles are dispersed in the insulation material, and most of the minute magnetic metal particles are not in contact with each other. Thus, a current almost does not flow through the minute particle region even though a current is applied to the TMR element for reversing magnetization. In a current range where the applied current is 0 (ampere) to a certain current value, the electrical resistance value of the minute particle region is higher than that of the magnetic tunnel junction. Consequently, in a range where the applied current for the TMR element is 0 (ampere) to the current value, a current flows through the magnetic tunnel junction, and a current that flows through the minute particle region is maintained at almost 0 (ampere).

When the magnitude of the applied current reaches the current value, a current flows among the minute magnetic metal particles due to a tunnel effect in the minute particle region. When the applied current is greater than or equal to the current value, the electrical resistance value of the minute particle region is lower than the electrical resistance value of the magnetic tunnel junction. Consequently, in a current range where the applied current for the TMR element is greater than or equal to the current value, the current that flows through the magnetic tunnel junction is not increased and is maintained at almost a constant value. Meanwhile, the current that flows through the minute particle region is increased as the applied current is increased.

When the applied current for the TMR element reaches the current value, and the current for reversing magnetization shows a certain current value in the magnetic tunnel junction, an excessive current that exceeds the current value bypasses the magnetic tunnel junction and flows through the minute particle region that is connected in parallel with the magnetic tunnel junction. Since the current that flows through the magnetic tunnel junction can have the current value as an upper limit, the TMR element can suppress input of an excessive current into the magnetic tunnel junction.

In the TMR element according to one aspect of the present disclosure, a thickness of the minute particle region may be greater than or equal to 0.2 nm and less than or equal to 50 nm. Accordingly, the minute magnetic metal particles can be efficiently dispersed in the insulation material, and a favorable minute particle region can be formed.

In the TMR element according to one aspect of the present disclosure, a distance between one minute magnetic metal particle and another minute magnetic metal particle may be greater than or equal to 0.2 nm and less than or equal to 10 nm. Accordingly, the tunnel effect easily occurs in the minute particle region.

In the TMR element according to one aspect of the present disclosure, a particle diameter of the minute magnetic metal particle may be greater than or equal to 0.2 nm and less than or equal to 10 nm. Accordingly, the plurality of minute magnetic metal particles can efficiently cause the tunnel effect in the minute particle region.

In the TMR element according to one aspect of the present disclosure, the minute magnetic metal particle may include at least one chemical element selected from the group consisting of Fe, Co, and Ni. Accordingly, since the minute magnetic metal particle has favorable magnetic properties, the magnetic volume occupying the TMR element is increased, and the operation of the TMR element is stabilized.

In the TMR element according to one aspect of the present disclosure, the magnetic tunnel junction may include a reference layer, a tunnel barrier layer that is stacked on the reference layer, and a magnetization free layer that is stacked on the tunnel barrier layer.

In the TMR element according to one aspect of the present disclosure, an area of the magnetization free layer may be smaller than an area of the tunnel barrier layer. Accordingly, in accordance with the inclination of the side surface of the magnetic tunnel junction, the TMR element can adjust an area in which the current for reversing magnetization bypasses the magnetic tunnel junction and flows through the minute particle region.

The TMR element according to one aspect of the present disclosure may further include a non-magnetic layer that is disposed under the reference layer of the magnetic tunnel junction, a pinning layer that is disposed under the non-magnetic layer, and a contact layer that is disposed under the pinning layer. The reference layer may form antiferromagnetic coupling with the pinning layer via the non-magnetic layer. An area of the magnetization free layer may be smaller than an area of the contact layer. Accordingly, the magnetic intensity of the pinning layer of which the magnetization direction is fixed is increased, and a range in which the size of the minute particle region can be adjusted is enlarged.

In addition, a magnetic memory according to one aspect of the present disclosure includes any of the above-mentioned TMR elements as a storage element.

In addition, a built-in memory according to one aspect of the present disclosure includes the magnetic memory.

According to the present disclosure, a TMR element that can suppress input of an excessive current into a magnetic tunnel junction is provided. In addition, a magnetic memory that includes the TMR element, and a built-in memory that includes the magnetic memory are provided.

BRIEF DESCRIPTION OF DRAWINGS

FIG. 1 is a cross-sectional plan view of an MRAM that includes a TMR element of a first embodiment.

FIG. 5 Part (a) of FIG. 5 is a view illustrating a relationship between an applied current for the TMR element according to the first embodiment and a current flowing through a magnetic tunnel junction. Part (b) of FIG. 5 is a view illustrating a relationship between the applied current for the TMR element according to the first embodiment and a current flowing through a minute particle region.

DESCRIPTION OF EMBODIMENTS

Figure 2:
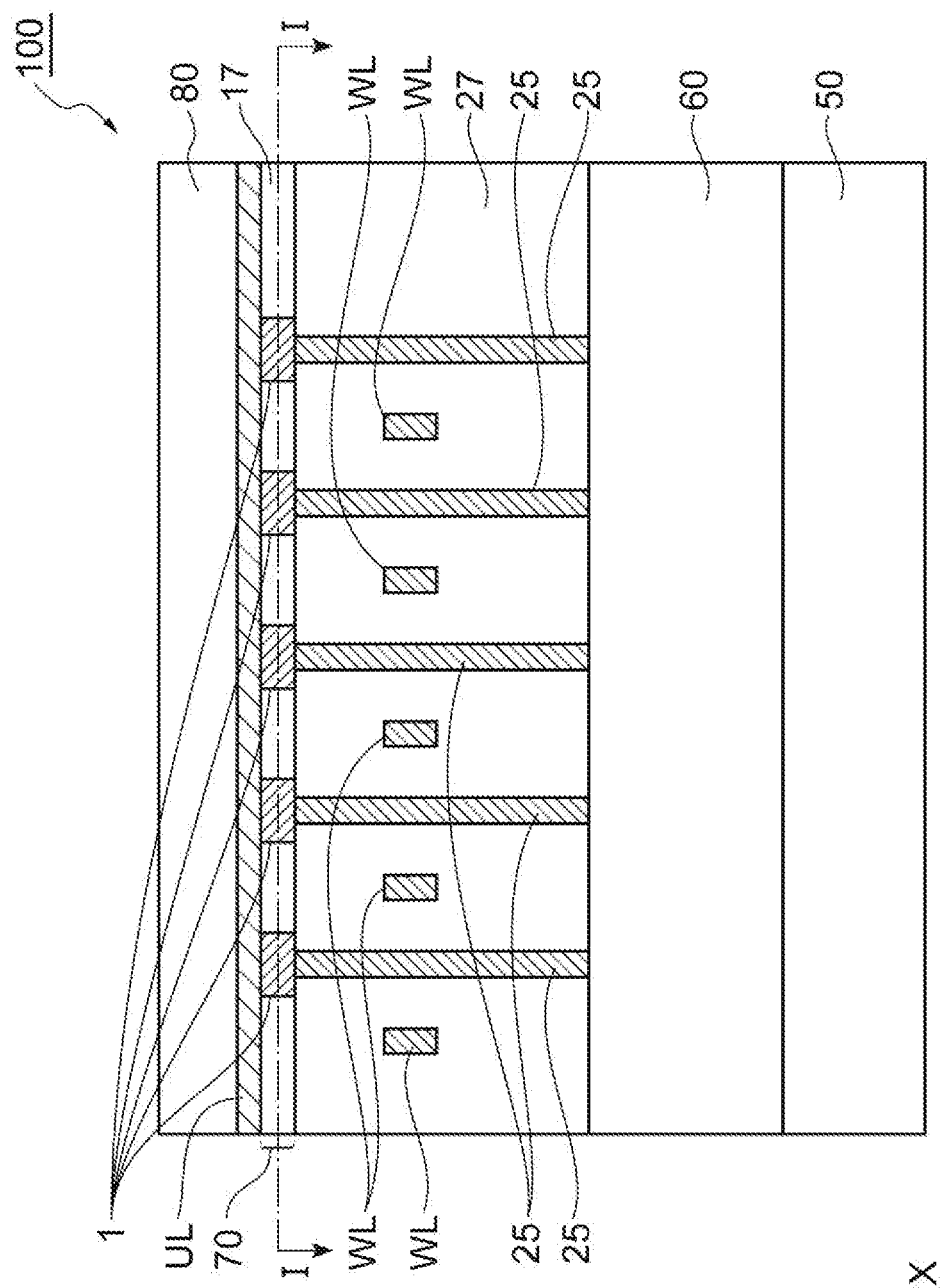
FIG. 2 is a schematic view of a vertical cross-section of the MRAM according to the first embodiment.

Hereinafter, embodiments of the present disclosure will be described in detail with reference to the appended drawings. In each drawing, the same reference signs are used for the same elements if possible. In addition, the ratio of dimensions in constituents and among constituents in the drawings is arbitrarily set for easy understanding of the drawings.

First Embodiment

FIG. 1 is a cross-sectional plan view of a magnetic memory (magnetoresistive random access memory; MRAM) that includes a perpendicular magnetization tunnel magnetoresistive effect element (TMR element) according to a first embodiment. FIG. 2 is a schematic view of a vertical cross-section of the MRAM according to the first embodiment. FIG. 1 corresponds to a cross-section of an MRAM 100 taken along line I-I in FIG. 2. A three-dimensional orthogonal coordinate system R is illustrated in FIG. 1 and the subsequent drawings when necessary. When the three-dimensional orthogonal coordinate system R is used, the thickness direction of each layer is set along a Z-axis direction, and two orthogonal axes that are perpendicular to the Z axis are set along an X axis and a Y axis.

As illustrated in FIG. 1, the MRAM 100 of the first embodiment includes a plurality of TMR elements 1 that are arranged in an array form (five rows and five columns in FIG. 1) in an XY plane. Each of the plurality of TMR elements 1 functions as a storage element of the MRAM 100. As will be described in detail later, each TMR element 1 includes a stack portion ST and a side wall portion 17 in which the stack portion ST is embedded. In addition, as illustrated in FIG. 2, the MRAM 100 includes a semiconductor substrate 50, a transistor array 60, a via interconnect part 25, an interlayer insulation layer 27, a word line WL, a TMR element array 70 including the side wall portion 17, an upper interconnect UL, and an insulation body 80 that covers the upper surface of the upper interconnect UL. In FIG. 1 and FIG. 2, other electrical interconnects that connect the upper interconnect UL to the transistor array 60 are not illustrated except the word line WL.

The transistor array 60 is disposed on the principal surface of the semiconductor substrate 50 that extends along the XY plane. The MRAM 100 includes a plurality of transistors T (refer to FIG. 3) that are disposed in an array form in order to drive the plurality of TMR elements 1. A plurality of the via interconnect parts 25 and a plurality of the word lines WL are disposed on the transistor array 60. Each via interconnect part 25 electrically connects one of the plurality of transistors T of the transistor array 60 to the plurality of TMR elements 1 of the TMR element array 70. The plurality of via interconnect parts 25 and the plurality of word lines WL are embedded in the interlayer insulation layer 27 and are insulated from each other by the interlayer insulation layer 27.

Figure 3:
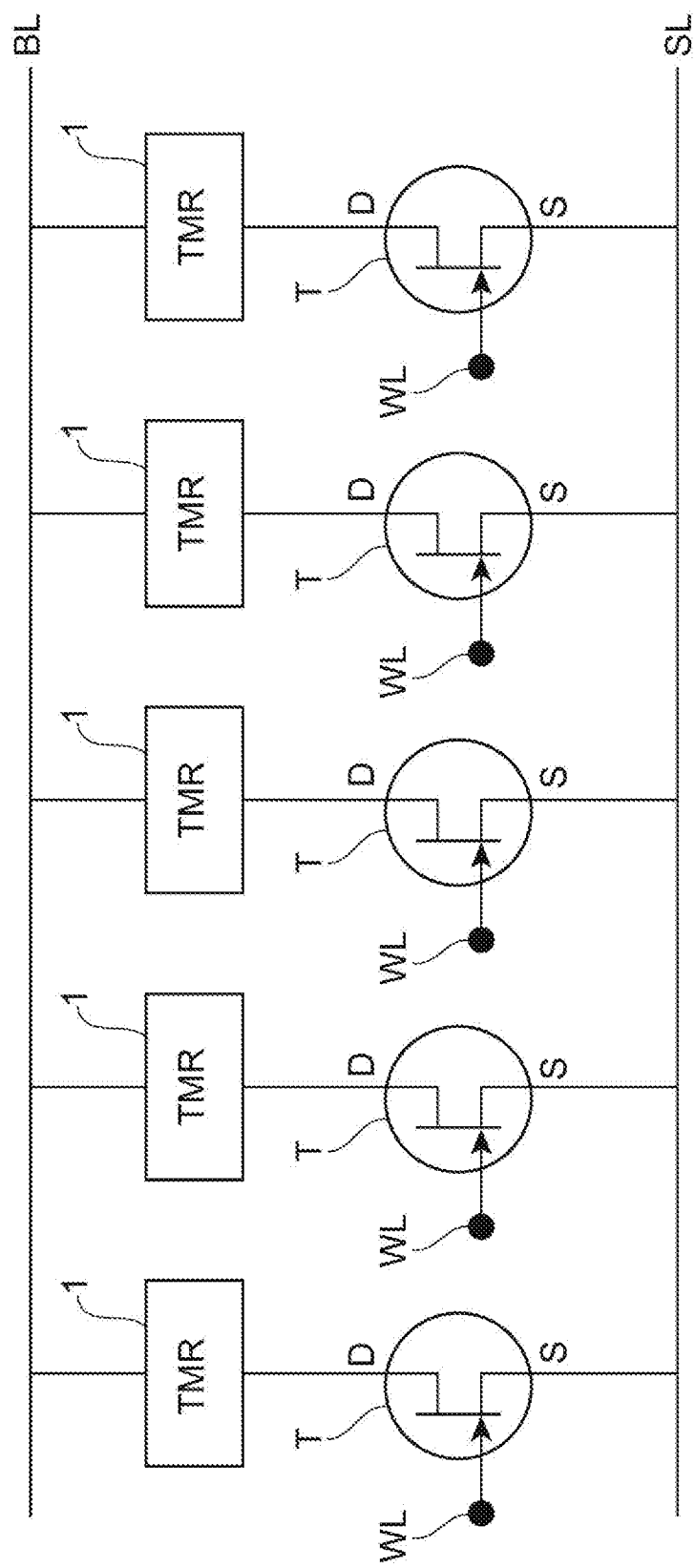
FIG. 3 is a view illustrating the electrical connection of the MRAM of the first embodiment.

FIG. 3 is a view illustrating the electrical connection of the MRAM of the first embodiment. In FIG. 3, only electrical connection related to five TMR elements 1 of the plurality of TMR elements 1 of the TMR element array 70 is illustrated.

As illustrated in FIG. 3, one end of each TMR element 1 is electrically connected to a drain D of each transistor T, respectively. The other end of each TMR element 1 is electrically connected to a bit line BL. The bit line BL is included in the upper interconnect UL (refer to FIG. 2). The gate of each transistor T is electrically connected to each word line WL respectively, and a source S of each transistor T is electrically connected to a source line SL. Each transistor T functions as the storage element of the MRAM 100. One transistor T and one transistor T electrically connected thereto constitute one memory cell.

When data is written into the memory cells of the MRAM 100, a selection voltage is applied to the word line WL that corresponds to the TMR element 1 of a write target. Then, in a state where this TMR element 1 is set to ON state, a voltage is applied between the bit line BL and the source line SL such that a current of which the polarity corresponds to the write data ("1" or "0") flows through the TMR element 1. The magnitude of the voltage applied at this point is set to a magnitude that may cause spin injection magnetization reversal in a magnetization free layer 7 (refer to FIG. 4) of the TMR element 1 as will be described later. Accordingly, the magnetization direction of the magnetization free layer 7 (refer to FIG. 4) of the TMR element 1 is set to a direction corresponding to the write data.

When data is read from the memory cells of the MRAM 100, a selection voltage is applied to the word line WL that corresponds to the TMR element 1 of a read target. Then, in a state where this TMR element 1 is set to ON state, a voltage that is smaller than the voltage at the time of writing is applied between the bit line BL and the source line SL. Accordingly, since a current of which the magnitude corresponds to data stored in the TMR element 1 flows between the bit line BL and the source line SL through the TMR element 1, the data is read by detecting the current value.

Figure 4:
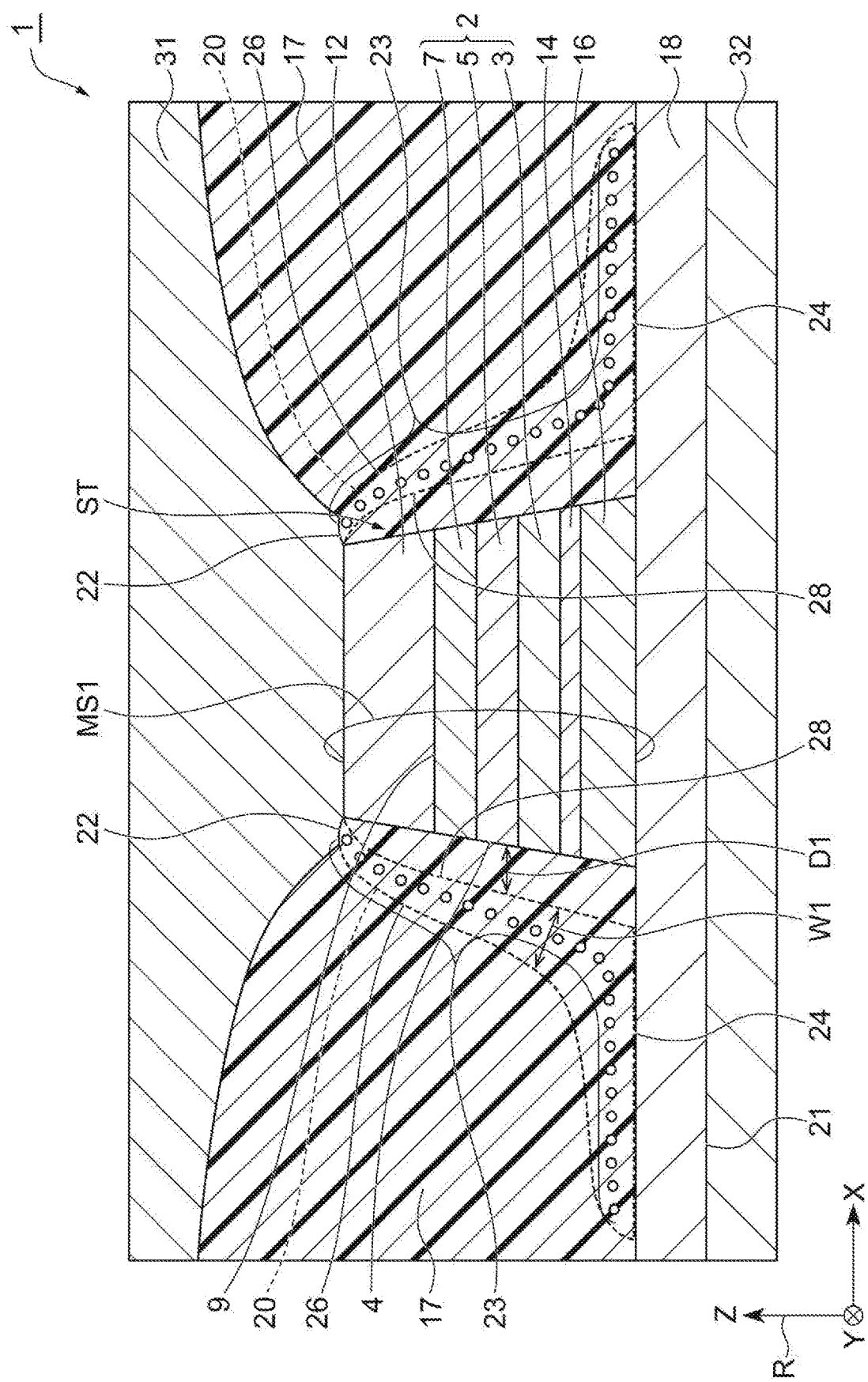
FIG. 4 is a cross-sectional view in the vicinity of the TMR element of the MRAM of the first embodiment.

Next, a detailed configuration of each TMR element 1 of the first embodiment will be described. FIG. 4 is a cross-sectional view in the vicinity of the TMR element of the MRAM of the first embodiment. FIG. 4 illustrates a cross-section in the vicinity of one TMR element 1 in the vertical cross-section of the MRAM 100 illustrated in FIG. 2.

As illustrated in FIG. 4, the TMR element 1 includes the stack portion ST and the side wall portion 17. The stack portion ST is configured with a plurality of layers that are stacked along a Z-axis direction which is a stack direction. The stack portion ST includes a magnetic tunnel junction 2. For example, the stack portion ST includes a cap layer 12 that is disposed on the magnetic tunnel junction 2. The magnetic tunnel junction 2 includes a reference layer 3, the magnetization free layer 7, and a tunnel barrier layer 5 that is stacked along the stack direction between the reference layer 3 and the magnetization free layer 7. In one example, in the magnetic tunnel junction 2, the tunnel barrier layer 5 is stacked on the reference layer 3, and the magnetization free layer 7 is stacked on the tunnel barrier layer 5. The reference layer 3 can function as a magnetization fixed layer. In the TMR element 1, the magnetization direction of the magnetization free layer 7 can be reversed using a spin-polarized current that flows through the magnetization free layer 7 via the tunnel barrier layer 5.

The magnetic tunnel junction 2 can further include a perpendicular magnetization inducing layer 9. The perpendicular magnetization inducing layer 9 imparts magnetic anisotropy along the stack direction to the magnetization free layer 7. The cap layer 12 constitutes one end of the TMR element 1. An upper electrode layer 31 is, for example, disposed on the cap layer 12 and the side wall portion 17. The magnetic tunnel junction 2 is electrically connected to the upper electrode layer 31 via the cap layer 12. The upper electrode layer 31 is electrically connected to the bit line BL (refer to FIG. 3). The thickness of the cap layer 12 is, for example, 4 to 100 nm.

For example, the stack portion ST further includes a non-magnetic layer 14, a pinning layer 16, and a contact layer 18. The non-magnetic layer 14 is disposed under the reference layer 3. The pinning layer 16 is disposed under the non-magnetic layer 14. The contact layer 18 is disposed under the pinning layer 16. The non-magnetic layer 14 is a layer that provides exchange coupling between the reference layer 3 and the pinning layer 16. The pinning layer 16 is a layer that strongly fixes the magnetization of the reference layer 3. The contact layer 18 is a layer that is in contact with a base layer 21 and promotes the crystallization of the pinning layer 16. In the first embodiment, the pinning layer 16, the non-magnetic layer 14, the magnetic tunnel junction 2, and the cap layer 12 constitute a mesa MS1. The mesa MS1 is, for example, formed using a method such as etching, and is acquired by performing the etching up to the pinning layer 16. For example, the TMR element 1 includes the base layer 21 under the contact layer 18. A lower electrode layer 32 is, for example, disposed under the base layer 21. The lower electrode layer 32 is electrically connected to the upper electrode layer 31 via the base layer 21, the contact layer 18, the pinning layer 16, the non-magnetic layer 14, the magnetic tunnel junction 2, and the cap layer 12.

The side wall portion 17 covers a side surface 4 of the magnetic tunnel junction 2, and includes an insulation material. The side wall portion 17 covers the side surface of the stack portion ST and electrically insulates the stack portion ST of the TMR element 1 from the stack portions of the other TMR elements. The insulation material is a nitride material such as SiN (silicon nitride), an oxynitride material such as SiON, or TaO, $Al_2O_3$, TiO, or AlSiO. The interlayer insulation layer 27 is, for example, disposed on each side surface of the via interconnect part 25 and the base layer 21.

In the magnetic tunnel junction 2, the tunnel barrier layer 5 can be formed of a material that induces magnetic anisotropy (perpendicular magnetic anisotropy) in the Z-axis direction in a region of the magnetization free layer 7 in the vicinity of the interface between the magnetization free layer 7 and the tunnel barrier layer 5. Accordingly, the tunnel barrier layer 5 imparts magnetic anisotropy in a direction (perpendicular direction) along the Z axis to the magnetization free layer 7 in cooperation with the perpendicular magnetization inducing layer 9. When the easy magnetization axis of the magnetization free layer 7 can be sufficiently stably directed in the direction along the Z axis by the action and the like of the perpendicular magnetization inducing layer 9, the tunnel barrier layer 5 may be formed of a material that does not induce perpendicular magnetic anisotropy in the magnetization free layer 7.

Since the easy magnetization axis of the magnetization free layer 7 is set in the direction along the Z axis, and the magnetization direction of the reference layer 3 is substantially fixed in the direction along the Z-axis direction, the magnetization direction of the reference layer 3 is parallel or antiparallel to the magnetization direction of the magnetization free layer 7 when the magnetization free layer 7 is not substantially affected by an external magnetic field or an STT. The stack portion ST in a state where the magnetization directions of the reference layer 3 and the magnetization free layer 7 are parallel to each other has a different electrical resistance value in the Z-axis direction from that of the stack portion ST in a state where the magnetization directions of the reference layer 3 and the magnetization free layer 7 are antiparallel to each other. Thus, these two states respectively correspond to "1" and "0" that are data of the memory cell of the MRAM 100.

The magnetization direction of the magnetization free layer 7 is reversed (that is, data is written into the memory cell in the MRAM 100) by spin injection magnetization reversal. Specifically, when the magnetization direction of the magnetization free layer 7 is reversed to a parallel state from an antiparallel state with respect to the magnetization direction of the reference layer 3, a voltage is applied between one end and the other end in the Z-axis direction of the stack portion ST such that the tunnel current flows through the tunnel barrier layer 5 in a direction from the magnetization free layer 7 toward the reference layer 3 (that is, spin-polarized electrons move toward the magnetization free layer 7 from the reference layer 3). Accordingly, from the spin-polarized electrons, the magnetization free layer 7 receives a spin transfer torque in a direction in which the magnetization direction of the magnetization free layer 7 rotates toward a parallel state from an antiparallel state with respect to the magnetization direction of the reference layer 3. The magnetization direction of the magnetization free layer 7 is reversed by setting the magnitude of the voltage to be higher than or equal to the threshold that causes spin injection magnetization reversal.

Conversely, when the magnetization direction of the magnetization free layer 7 is reversed to an antiparallel state from a parallel state with respect to the magnetization direction of the reference layer 3, a voltage is applied between one end and the other end in the Z-axis direction of the stack portion ST such that the tunnel current flows through the tunnel barrier layer 5 in a direction from the reference layer 3 toward the magnetization free layer 7 (that is, spin-polarized electrons move toward the reference layer 3 from the magnetization free layer 7). Accordingly, from the spin-polarized electrons, the magnetization free layer 7 receives a spin transfer torque in a direction in which the magnetization direction of the magnetization free layer 7 rotates toward an antiparallel state from a parallel state with respect to the magnetization direction of the reference layer 3. The magnetization direction of the magnetization free layer 7 is reversed by setting the magnitude of the voltage to be higher than or equal to the threshold that causes spin injection magnetization reversal.

In the first embodiment, the TMR element 1 includes a minute particle region 20. The minute particle region 20 is disposed in the side wall portion 17. The minute particle region 20 has a granular structure and includes an insulation material and minute magnetic metal particles 23 that are dispersed in the insulation material. The insulation material included in the minute particle region 20 can be the same as the insulation material included in the side wall portion 17. The minute particle region 20 is, for example, formed by dispersing magnetic metal chemical elements in the insulation material constituting the side wall portion 17 using a method such as sputtering.

The minute particle region 20 extends in the side wall portion 17 outside the mesa MS1. In addition, an upper end 22 of the minute particle region 20 is, for example, in contact with the upper electrode layer 31, and a lower end 24 of the minute particle region 20 is in contact with the contact layer 18 that is electrically connected to the lower electrode layer 32. The upper electrode layer 31 can be electrically connected to the lower electrode layer 32 via the minute particle region 20. The minute particle region 20 is electrically connected in parallel with the magnetic tunnel junction 2.

Part (a) of FIG. 5 is a view illustrating a relationship between an applied current for the TMR element according to the first embodiment and a current flowing through the magnetic tunnel junction. Part (b) of FIG. 5 is a view illustrating a relationship between the applied current for the TMR element according to the first embodiment and a current flowing through the minute particle region.

As illustrated in part (a) of FIG. 5, in a range where an applied current $I_0$ for the TMR element 1 is equal to 0 (ampere) to Is (ampere), a current I that flows through the magnetic tunnel junction 2 is gradually increased as the applied current $I_0$ is increased. When the applied current $I_0$ is equal to the current value Is (ampere), the current that flows through the magnetic tunnel junction 2 shows a current value It (ampere). In a range where the applied current $I_0$ is greater than or equal to the current value Is (ampere), the current I that flows through the magnetic tunnel junction 2 is maintained the current value It (ampere) and a value in the vicinity of the current value It (ampere) with the current value It (ampere) as almost an upper limit. The current value It (ampere) can be a current value equal to the maximum value of current that does not damage the magnetic tunnel junction 2, or less than this maximum value. In a range where the applied current $I_0$ is equal to 0 (ampere) to –Is (ampere), the relationship between the applied current $I_0$ and the current I is the same as the relationship between the applied current $I_0$ and the current I in the range where the applied current $I_0$ is equal to 0 (ampere) to Is (ampere).

As illustrated in part (b) of FIG. 5, in a range where the applied current $I_0$ for the TMR element 1 is equal to 0 (ampere) to Is (ampere), a current J that flows through the minute particle region 20 is maintained at almost 0 (ampere) even when the applied current $I_0$ is increased. Meanwhile, when the applied current $I_0$ reaches the current value Is (ampere), the current J that flows through the minute particle region 20 has a value greater than 0 (ampere). In a current range where the applied current $I_0$ is greater than the current value Is (ampere), the current J that flows through the minute particle region 20 is increased as the applied current $I_0$ is increased. In a current range where the applied current $I_0$ is greater than –Is (ampere), the relationship between the applied current $I_0$ and the current J is the same as the relationship between the applied current $I_0$ and the current J in a current range where the applied current $I_0$ is greater than the current value Is (ampere).

In the minute particle region 20, minute magnetic metal particles are dispersed in the insulation material, and most of the minute magnetic metal particles are not in contact with each other. Thus, in a range where the applied current $I_0$ is equal to 0 (ampere) to a certain current value, a current almost does not flow through the minute particle region 20 even though a current is applied to the TMR element 1 for reversing magnetization. In a current range where the applied current $I_0$ is equal to 0 (ampere) to the current value, the electrical resistance value of the minute particle region 20 is higher than the electrical resistance value of the magnetic tunnel junction 2. Consequently, as illustrated in part (a) of FIG. 5 and part (b) of FIG. 5, in a range where the applied current $I_0$ for the TMR element 1 is equal to 0 (ampere) to the current value, that is, Is (ampere), the current I flows through the magnetic tunnel junction 2, and the current J that flows through the minute particle region 20 is maintained at almost 0 (ampere).

When the magnitude of the applied current $I_0$ reaches the current value Is, a current flows between particles among the minute magnetic metal particles 23 due to a tunnel effect in the minute particle region 20. When the applied current $I_0$ is greater than or equal to the current value Is, the electrical resistance value of the minute particle region 20 is lower than the electrical resistance value of the magnetic tunnel junction 2. Consequently, as illustrated in part (a) of FIG. 5 and part (b) of FIG. 5, in a current range where the applied current $I_0$ for the TMR element 1 is greater than or equal to Is (ampere), the current I that flows through the magnetic tunnel junction 2 is not increased and is maintained at almost a constant value. Meanwhile, the current J that flows through the minute particle region 20 is increased as the applied current $I_0$ is increased.

Part (a) of FIG. 5 and part (b) of FIG. 5 show that when the applied current $I_0$ for the TMR element 1 reaches the current value Is, and the magnitude of the current for reversing magnetization becomes equal to the current value It in the magnetic tunnel junction 2, an excessive current that exceeds the current value It bypasses the magnetic tunnel junction 2 and flows through the minute particle region 20 that is connected in parallel with the magnetic tunnel junction 2. Since the current I that flows through the magnetic tunnel junction 2 can have the current value It as an upper limit, the TMR element 1 can suppress input of an excessive current into the magnetic tunnel junction 2. The current value Is of the applied current can be a value that is greater than or equal to a threshold for reversing the magnetization direction of the magnetization free layer 7 by spin injection magnetization reversal and less than the current damaging the magnetic tunnel junction 2. In one example, the current value Is of the applied current value is 5 to 50 milliamperes.

Figure 6:
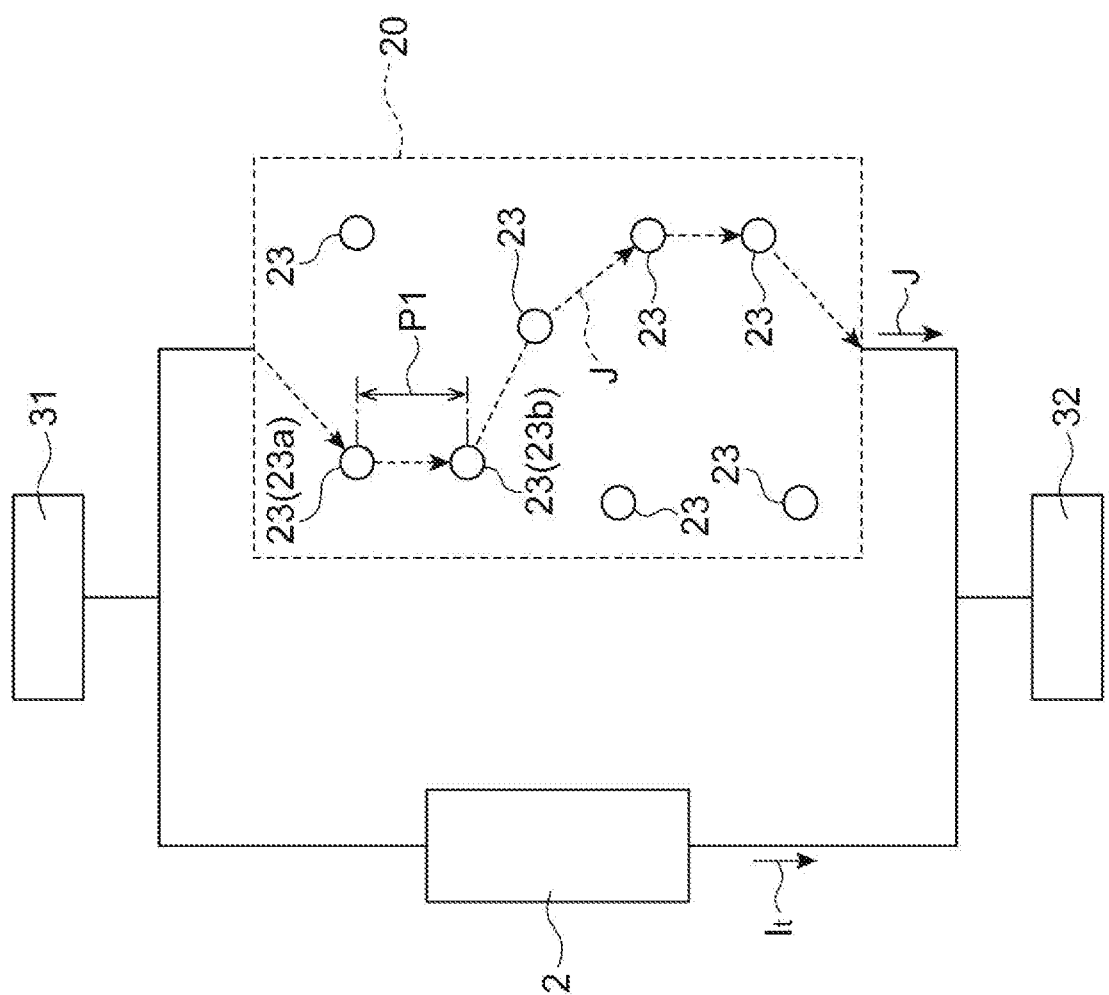
FIG. 6 is a view illustrating parallel connection in the TMR element of the first embodiment.

FIG. 6 is a view illustrating parallel connection in the TMR element of the first embodiment. The minute particle region 20 and the magnetic tunnel junction 2 are electrically connected in parallel with the upper electrode layer 31 and the lower electrode layer 32. As illustrated in FIG. 6, a plurality of the minute magnetic metal particles 23 are present in a dispersed manner in the minute particle region 20. By this dispersion, the current J that flows through the minute particle region 20 is almost equal to 0 (ampere) in a current range to the current value Is even when the applied current $I_0$ for the TMR element 1 is increased. Meanwhile, when the applied current $I_0$ exceeds the current value Is, the current J flows between particles that are close to each other among the minute magnetic metal particles 23, for example, between a minute magnetic metal particle 23a and a minute magnetic metal particle 23b, due to the tunnel effect. Since the current J flows through the minute particle region 20, the current I that flows through the magnetic tunnel junction 2 is not increased and is maintained at the current value It. In the TMR element 1, an excessive current that exceeds the current value It does not flow through the magnetic tunnel junction 2, and the current J that bypasses the magnetic tunnel junction 2 flows through the minute particle region 20.

FIG. 4 is referred to again. As illustrated in FIG. 4, the minute particle region 20 includes an outer part 26 and an inner part 28. A distance D1 from the inner part 28 of the minute particle region 20 to the side surface 4 of the magnetic tunnel junction 2 along a direction (X-axis direction) intersecting with the stack direction is, for example, a greater than or equal to 1 nm and less than or equal to 20 nm. The side surface 4 of the magnetic tunnel junction 2 includes the insulation material of the side wall portion 17 between the side surface 4 and the inner part 28 of the minute particle region 20. The magnetic tunnel junction 2 can be electrically connected to the upper electrode layer 31 and the lower electrode layer 32 in parallel with the minute particle region 20.

A thickness W1 of the minute particle region 20 can be greater than or equal to 0.2 nm and less than or equal to 50 nm. Accordingly, the minute magnetic metal particles can be efficiently dispersed in the insulation material, and a favorable minute particle region can be formed. The thickness W1 of the minute particle region 20 may be, for example, greater than or equal to 0.2 nm and less than or equal to 10 nm. Accordingly, the minute magnetic metal particles can be more efficiently dispersed in the insulation material, and a more favorable minute particle region can be formed.

In the minute particle region 20, a distance P1 (refer to FIG. 6) between one minute magnetic metal particle 23 and another minute magnetic metal particle 23 can be greater than or equal to 0.2 nm and less than or equal to 10 nm. The distance P1 is, for example, the distance between one minute magnetic metal particle 23a and another minute magnetic metal particle 23b that is dispersed at a position closest to the one minute magnetic metal particle 23a. In the TMR element 1, this distance between the particles causes the tunnel effect to easily occur in the minute particle region 20. The distance between one minute magnetic metal particle and another minute magnetic metal particle may be greater than or equal to 0.2 nm and less than or equal to 5 nm. Accordingly, the tunnel effect more easily occurs in the minute particle region 20.

When the minute particle region 20 is formed by sputtering, for example, the distance P1 between the formed minute magnetic metal particles can be changed by adjusting the rate of forming the minute magnetic metal particles. The rate of forming the minute magnetic metal particles is, for example, adjusted using a voltage or a gas pressure. In order to set the distance P1 between the minute magnetic metal particles to be, for example, greater than or equal to 0.2 nm and less than or equal to 10 nm, the sputtering voltage is, for example, 0.5 to 2 kilovolts, and the sputtering time period is, for example, 1 to 10 seconds. The gas pressure of the sputtering is, for example, 0.1 Pa to 20 Pa.

The particle diameter of each minute magnetic metal particle can be greater than or equal to 0.2 nm and less than or equal to 10 nm. Accordingly, the plurality of minute magnetic metal particles can efficiently cause the tunnel effect in the minute particle region. The particle diameter of each minute magnetic metal particle may be greater than or equal to 3 nm and less than or equal to 5 nm. Accordingly, the plurality of minute magnetic metal particles can more efficiently cause the tunnel effect in the minute particle region.

In the first embodiment, in order to set the particle diameter of each minute magnetic metal particle 23 to be, for example, greater than or equal to 0.2 nm and less than or equal to 10 nm, the sputtering voltage is, for example, 1 to 2 kilovolts, and the sputtering time period is, for example, 1 to 10 seconds. The gas pressure of the sputtering is, for example, 0.1 Pa to 1 Pa.

Each minute magnetic metal particle can include at least one chemical element selected from a group consisting of Fe, Co, and Ni. Since each minute magnetic metal particle has favorable magnetic properties, the magnetic volume occupying the TMR element 1 is increased, and the operation of the TMR element 1 is stabilized.

In the first embodiment, in the magnetic tunnel junction 2, the reference layer 3 is formed of a ferromagnetic material such as Co, a Co—Fe alloy, or a Co—Fe—B alloy. The magnetization direction of the reference layer 3 is substantially fixed along the Z-axis direction. The thickness of the reference layer 3 in the Z-axis direction can be, for example, greater than or equal to 3 nm and less than or equal to 10 nm. The reference layer 3 can have a structure in which a multilayer film such as Co/Pt or Co/Ni is repeatedly stacked such that the magnetization direction of each magnetic layer is in a perpendicular direction.

Furthermore, the reference layer 3 can have a structure in which magnetic fields that occur in the reference layer 3 offset each other using the RKKY interaction that occurs through a thin film of Ru, Ir, or the like. This structure is a synthetic anti-ferromagnet (SAF) structure, that is, a structure that includes two ferromagnetic layers formed of a ferromagnetic material and a non-magnetic layer stacked between the two ferromagnetic layers in which the magnetization directions of the two ferromagnetic layers are coupled to each other through the non-magnetic layer in antiparallel by exchange coupling that is based on the RKKY interaction.

The tunnel barrier layer 5 is formed of an insulation material. The tunnel barrier layer 5 is preferably configured to induce perpendicular magnetic anisotropy in the magnetization free layer 7 based on the same principle as the perpendicular magnetization inducing layer 9. The reason is that the perpendicular magnetization of the magnetization free layer 7 is more stable, and the film thickness of the magnetization free layer 7 can be increased. The material constituting the tunnel barrier layer 5 that may induce perpendicular magnetic anisotropy in the magnetization free layer 7 can be exemplified, for example, by MgO, ZnO, $GaO_x$, or an oxide material that has a spinel structure represented by General Formula $AB_2O_4$ (in the formula, A is at least one kind of chemical element selected from a group consisting of Mg and Zn, and B is at least one kind of chemical element selected from a group consisting of Al, Ga, and In).

The tunnel barrier layer 5 may be configured not to induce perpendicular magnetic anisotropy in the magnetization free layer 7. In this case, the tunnel barrier layer 5 can be formed of $AlN_x$, $Cu(In_{0.8}Ga_{0.2})Se_2$, or the like.

The thickness in the Z-axis direction of the tunnel barrier layer 5 is small such that a tunnel current flows through the tunnel barrier layer 5 in the Z-axis direction when a voltage is applied between the reference layer 3 and the magnetization free layer 7. The thickness of the tunnel barrier layer 5 in the Z-axis direction can be, for example, greater than or equal to 1 nm and less than or equal to 3 nm.

The magnetization free layer 7 is formed of a ferromagnetic material such as Fe, Co—Fe, Co—Fe—B, or a ferromagnetic Heusler alloy. The magnetization direction of the magnetization free layer 7 is substantially not fixed.

The thickness of the magnetization free layer 7 in the Z-axis direction is small such that the easy magnetization axis of the magnetization free layer 7 is stably set in the direction along the Z axis by the function of imparting magnetic anisotropy exhibited by the tunnel barrier layer 5 and the perpendicular magnetization inducing layer 9 as described above. The thickness can be, for example, greater than or equal to 1 nm and less than or equal to 3 nm.

The perpendicular magnetization inducing layer 9 is, for example, formed of MgO, ZnO, $Ga_2O_3$, or an oxide material that has a spinel structure represented by General Formula $AB_2O_4$ (in the formula, A is at least one kind of chemical element selected from a group consisting of Mg and Zn, and B is at least one kind of chemical element selected from a group consisting of Al, Ga, and In).

The perpendicular magnetization inducing layer 9 is preferably configured such that the resistance value of the perpendicular magnetization inducing layer 9 along the Z-axis direction per unit area in the XY plane is smaller than that of the tunnel barrier layer 5. Particularly, when the perpendicular magnetization inducing layer 9 is formed of an insulation material, the thickness in the Z-axis direction of the perpendicular magnetization inducing layer 9 is preferably smaller than the thickness in the Z-axis direction of the tunnel barrier layer 5.

The perpendicular magnetization inducing layer 9 is formed of a material that induces magnetic anisotropy (perpendicular magnetic anisotropy) in the direction along the Z axis in a region of the magnetization free layer 7 in the vicinity of the interface between the magnetization free layer 7 and the perpendicular magnetization inducing layer 9 based on the spin-orbit interaction. Accordingly, the perpendicular magnetization inducing layer 9 imparts magnetic anisotropy in the direction (perpendicular direction) along the Z axis to the magnetization free layer 7 in cooperation with the tunnel barrier layer 5.

The magnetic tunnel junction 2 may not include the perpendicular magnetization inducing layer 9. In this case, the magnetization direction of the reference layer 3 may be fixed in a direction (in-plane direction; that is, a direction parallel to the XY plane) that intersects with the stack direction, and the easy magnetization axis of the magnetization free layer 7 may be set in the in-plane direction.

In the TMR element 1, the non-magnetic layer 14 is formed of a material such as Ru or Ir, and the thickness of the non-magnetic layer 14 is, for example, 0.2 to 3 nm. The pinning layer 16 is formed of a material such as CoFeB or Co, and the thickness of the pinning layer 16 is, for example, 2 to 20 nm. The contact layer 18 is formed of a material such as Ru or Ta, and the thickness of the contact layer 18 is, for example, 2 to 20 nm. The upper electrode layer 31 includes a chemical element such as Al and/or Cu, and the lower electrode layer 32 includes a chemical element such as Al and/or Cu.

In the first embodiment, in the magnetic tunnel junction 2, for example, the reference layer 3, the tunnel barrier layer 5, and the magnetization free layer 7 are stacked in this order on the upper side (in the Z-axis direction), and the magnetization free layer 7 is positioned above the reference layer 3 and the tunnel barrier layer 5. For example, an inclination is provided such that the width of the magnetic tunnel junction 2 is monotonously decreased in a direction from the reference layer 3 toward the magnetization free layer 7. The area of the magnetization free layer 7 can be smaller than that of the tunnel barrier layer 5. In accordance with the inclination of the side surface 4 of the magnetic tunnel junction 2, the TMR element 1 can adjust an area in which the current for reversing magnetization bypasses the magnetic tunnel junction 2 and flows through the minute particle region 20.

In the magnetic tunnel junction 2, for example, the reference layer 3 can be positioned below the magnetization free layer 7 and the tunnel barrier layer 5. Since the pinning layer 16 is disposed under the non-magnetic layer 14, and the contact layer 18 is disposed under the pinning layer 16, the reference layer 3 can form antiferromagnetic coupling with the pinning layer 16 via the non-magnetic layer 14. Accordingly, the magnetic intensity of the pinning layer 16 of which the magnetization direction is fixed is increased. In addition, the area of the magnetization free layer 7 can be smaller than that of the contact layer 18. A range in which the size of the minute particle region 20 can be adjusted is enlarged.

In the TMR element 1, the via interconnect part 25 is formed of a conductive material. The via interconnect part 25 is, for example, formed of a metal such as Cu. The base layer 21 is formed of a conductive material. The base layer 21 is, for example, formed of a conductive oxide, a conductive nitride, a conductive oxynitride, or a silicide. Thus, the lower surface of the reference layer 3, which is one end of the TMR element 1 of the first embodiment, is electrically connected to the drain D (refer to FIG. 3) of the transistor T through the base layer 21 and the via interconnect part 25.

The base layer 21 is disposed in order to improve the flatness of each layer of the stack portion ST, particularly, the tunnel barrier layer 5. Thus, the flatness of the upper surface of the base layer 21 is set to be higher than the flatness of the upper surface of the via interconnect part 25. The upper surface of the base layer 21 has high flatness and extends along the XY plane. The stack portion ST is formed on the upper surface of the base layer 21. The via interconnect part 25 and the base layer 21 are embedded in the interlayer insulation layer 27 and, by the interlayer insulation layer 27, are electrically insulated from the via interconnect parts and the base layers that are electrically connected to the other TMR elements 1.

Second Embodiment

Figure 7:
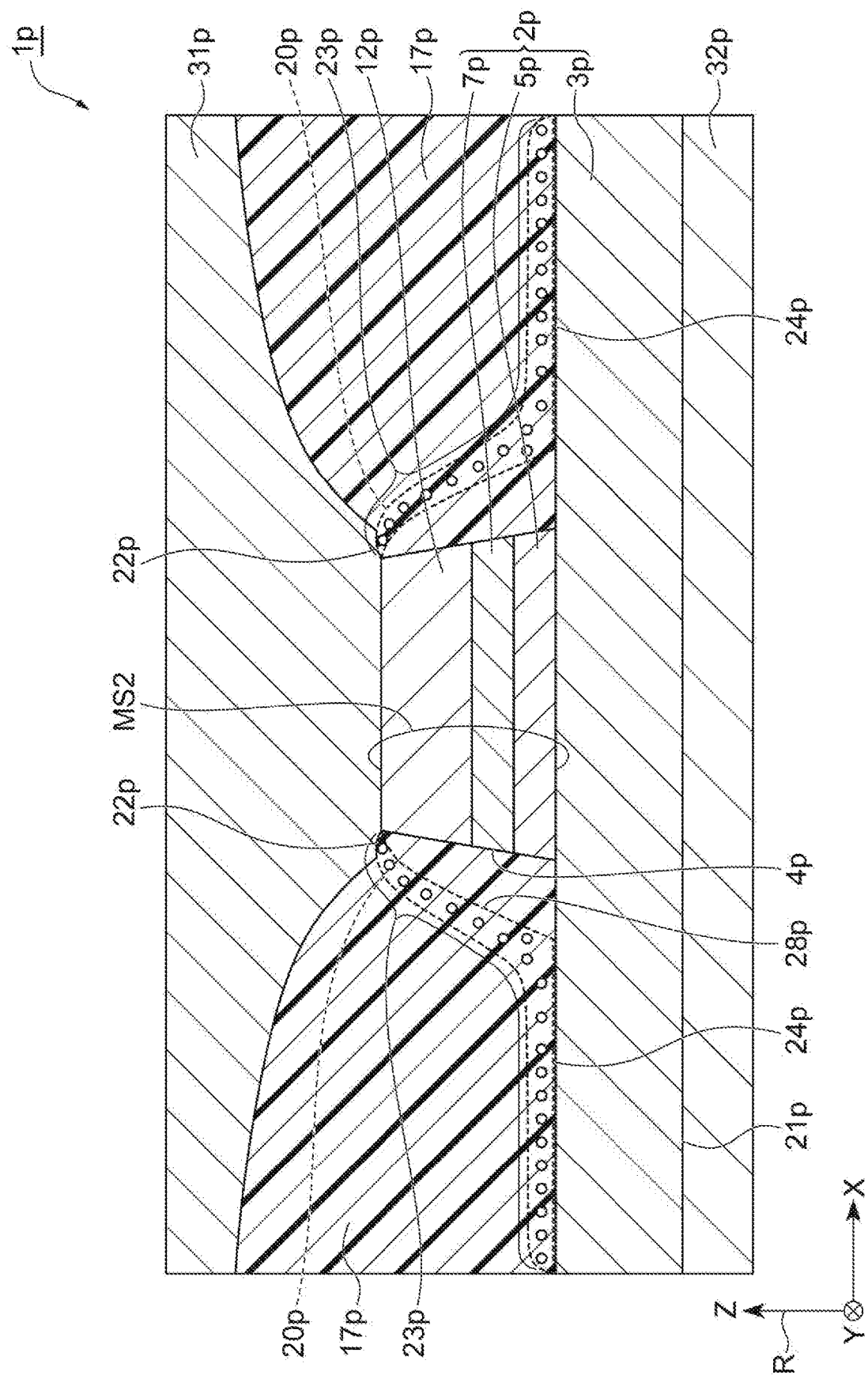
FIG. 7 is a cross-sectional view in the vicinity of a TMR element of an MRAM of a second embodiment.

FIG. 7 is a cross-sectional view in the vicinity of a TMR element of an MRAM of a second embodiment, and corresponds to FIG. 4 in the first embodiment. A TMR element 1$p$ of the second embodiment includes a magnetic tunnel junction 2$p$ and a side wall portion 17$p$ that covers a side surface 4$p$ of the magnetic tunnel junction 2$p$. For example, the magnetic tunnel junction 2$p$ includes a reference layer 3$p$, a tunnel barrier layer 5$p$ on the reference layer 3$p$, and a magnetization free layer 7$p$ on the tunnel barrier layer 5$p$. A cap layer 12$p$ is, for example, disposed on the magnetic tunnel junction 2$p$. In the second embodiment, the tunnel barrier layer 5$p$, the magnetization free layer 7$p$, and the cap layer 12$p$ constitute a mesa MS2. For example, the mesa MS2 is formed using a method such as etching, and is fabricated by performing the etching up to the tunnel barrier layer 5$p$. For example, the mesa MS2 has an inclination such that the width of the mesa MS2 is monotonously decreased in a direction from a lower layer to an upper layer.

In the TMR element 1$p$, an upper electrode layer 31$p$ is, for example, disposed on the cap layer 12$p$ and the side wall portion 17$p$. A base layer 21$p$ is, for example, disposed under the reference layer 3$p$. A lower electrode layer 32$p$ is, for example, disposed under the base layer 21$p$. The lower electrode layer 32$p$ is, for example, electrically connected to the upper electrode layer 31$p$ via the base layer 21$p$, the reference layer 3$p$, the tunnel barrier layer 5$p$, the magnetization free layer 7$p$, and the cap layer 12$p$. The side wall portion 17$p$ includes an insulation material.

A minute particle region 20$p$ is disposed in the side wall portion 17$p$. The minute particle region 20$p$ has a granular structure and includes an insulation material and minute magnetic metal particles 23$p$ that are dispersed in the insulation material. The insulation material of the minute particle region 20$p$ is, for example, the same as the insulation material of the side wall portion 17$p$. The minute particle region 20$p$ extends in the side wall portion 17$p$ outside the mesa MS2. For example, an upper end 22$p$ of the minute particle region 20$p$ is in contact with the upper electrode layer 31$p$, and a lower end 24$p$ of the minute particle region 20$p$ is in contact with the reference layer 3$p$ that is electrically connected to the lower electrode layer 32$p$. The upper electrode layer 31$p$ can be electrically connected to the lower electrode layer 32$p$ via the minute particle region 20$p$. The minute particle region 20$p$ is electrically connected in parallel with the magnetic tunnel junction 2$p$. The side wall portion 17$p$ is included between an inner part 28$p$ of the minute particle region 20$p$ and the side surface 4$p$ of the magnetic tunnel junction 2$p$.

Third Embodiment

Figure 8:
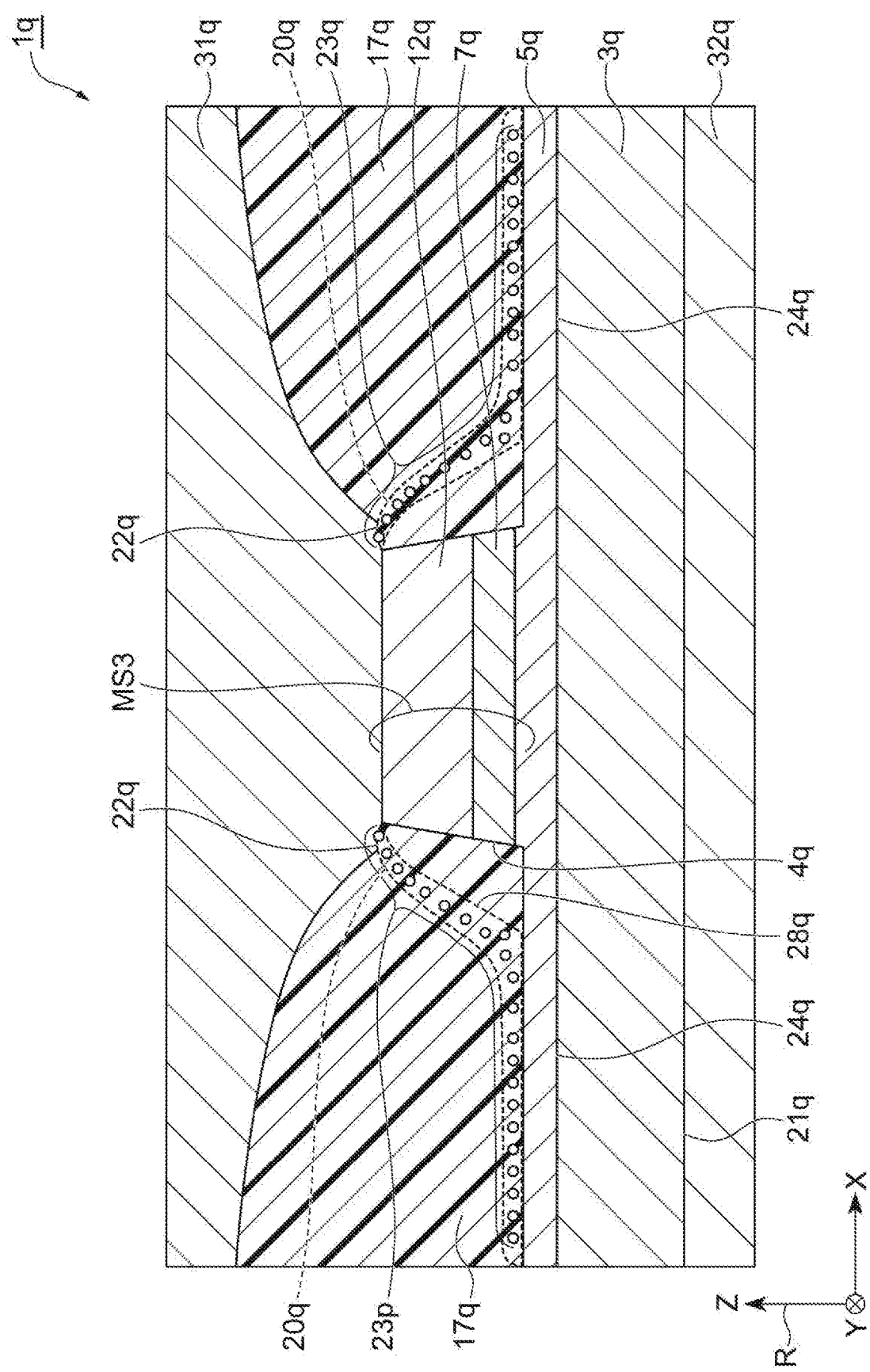
FIG. 8 is a cross-sectional view in the vicinity of a TMR element of an MRAM of a third embodiment.

FIG. 8 is a cross-sectional view in the vicinity of a TMR element of an MRAM of a third embodiment, and corresponds to FIG. 4 in the first embodiment. A TMR element 1$q$ of the third embodiment includes a magnetic tunnel junction (defined as 2$q$) and a side wall portion 17$q$ that covers a side surface 4$q$ of the magnetic tunnel junction 2$q$. For example, the magnetic tunnel junction 2$q$ includes a reference layer 3$q$, a tunnel barrier layer 5$q$ on the reference layer 3$q$, and a magnetization free layer 7$q$ on the tunnel barrier layer 5$q$. A cap layer 12$q$ is, for example, disposed on the magnetic tunnel junction 2$q$. In the third embodiment, a part of the tunnel barrier layer 5$q$, the magnetization free layer 7$q$, and the cap layer 12$q$ constitute a mesa MS3. For example, the mesa MS3 is formed using a method such as etching, and is acquired by performing the etching up to a position in the middle of the tunnel barrier layer 5$q$. For example, the mesa MS3 has an inclination such that the width of the mesa MS3 is monotonously decreased in a direction from a lower layer to an upper layer.

In the TMR element 1$q$, an upper electrode layer 31$q$ is, for example, disposed on the cap layer 12$q$ and the side wall portion 17$q$. A base layer 21$q$ is, for example, disposed under the reference layer 3$q$. A lower electrode layer 32$q$ is, for example, disposed under the base layer 21$q$. The lower electrode layer 32$q$ is, for example, electrically connected to the upper electrode layer 31$q$ via the base layer 21$q$, the reference layer 3$q$, the tunnel barrier layer 5$q$, the magnetization free layer 7$q$, and the cap layer 12$q$. The side wall portion 17$q$ includes an insulation material.

A minute particle region 20$q$ is disposed in the side wall portion 17$q$. The minute particle region 20$q$ has a granular structure and includes an insulation material and minute magnetic metal particles 23$q$ that are dispersed in the insulation material. The insulation material of the minute particle region 20$q$ is, for example, the same as the insulation material of the side wall portion 17$q$. The minute particle region 20$q$ extends in the side wall portion 17$q$ outside the mesa MS3. An upper end 22$q$ of the minute particle region 20$q$ is, for example, in contact with the upper electrode layer 31$q$, and a lower end 24$q$ of the minute particle region 20$q$ is, for example, in contact with the tunnel barrier layer 5$q$ that is electrically connected to the lower electrode layer 32$q$. The upper electrode layer 31$q$ can be electrically connected to the lower electrode layer 32$q$ via the minute particle region 20$q$. The minute particle region 20$q$ is electrically connected in parallel with the magnetic tunnel junction 2$q$. The side wall portion 17$q$ is included between an inner part 28q of the minute particle region 20q and the side surface 4q of the magnetic tunnel junction 2q.

Fourth Embodiment

Figure 9:
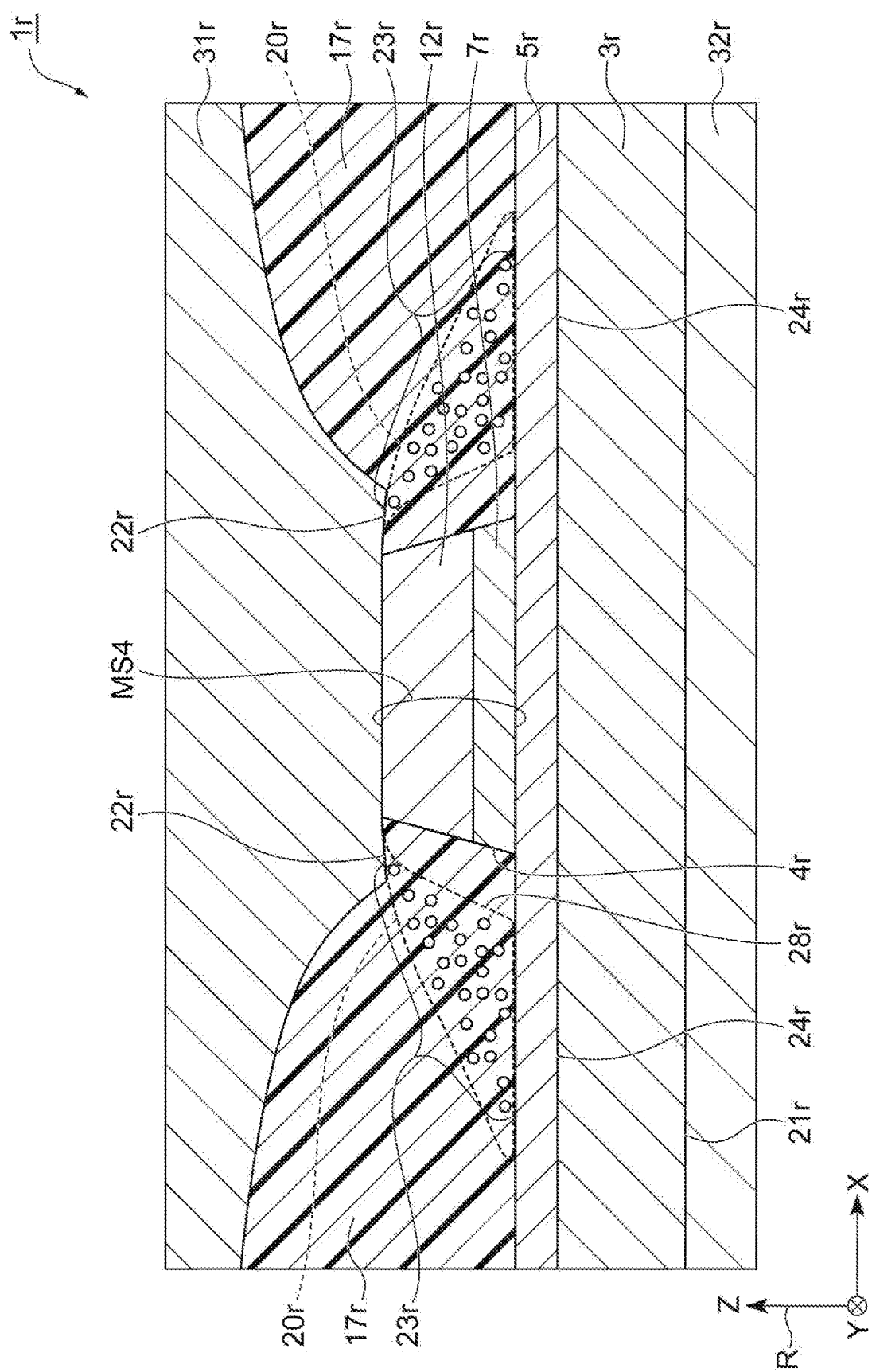
FIG. 9 is a cross-sectional view in the vicinity of a TMR element of an MRAM of a fourth embodiment.

FIG. 9 is a cross-sectional view in the vicinity of a TMR element of an MRAM of a fourth embodiment, and corresponds to FIG. 4 in the first embodiment. A TMR element 1r of the fourth embodiment includes a magnetic tunnel junction (defined as 2r) and a side wall portion 17r that covers a side surface 4r of the magnetic tunnel junction 2r. For example, the magnetic tunnel junction 2r includes a reference layer 3r, a tunnel barrier layer 5r on the reference layer 3r, and a magnetization free layer 7r on the tunnel barrier layer Sr. A cap layer 12r is, for example, disposed on the magnetic tunnel junction 2r. In the fourth embodiment, the magnetization free layer 7r and the cap layer 12r constitute a mesa MS4. For example, the mesa MS4 is formed using a method such as etching, and is fabricated by performing the etching up to the magnetization free layer 7r. For example, the mesa MS4 has an inclination such that the width of the mesa MS4 is monotonously decreased in a direction from a lower layer to an upper layer.

In the TMR element 1r, for example, an upper electrode layer 31r is disposed on the cap layer 12r and the side wall portion 17r. A base layer 21r is, for example, disposed under the reference layer 3r. A lower electrode layer 32r is, for example, disposed under the base layer 21r. The lower electrode layer 32r is, for example, electrically connected to the upper electrode layer 31r via the base layer 21r, the reference layer 3r, the tunnel barrier layer 5r, the magnetization free layer 7r, and the cap layer 12r. The side wall portion 17r includes an insulation material.

A minute particle region 20r is disposed in the side wall portion 17r. The minute particle region 20r has a granular structure and includes an insulation material and minute magnetic metal particles 23r that are dispersed in the insulation material. The insulation material of the minute particle region 20r is, for example, the same as the insulation material of the side wall portion 17r. The minute particle region 20r extends in the side wall portion 17r outside the mesa MS4. For example, an upper end 22r of the minute particle region 20r is in contact with the upper electrode layer 31r, and a lower end 24r of the minute particle region 20r is in contact with the tunnel barrier layer 5r that is electrically connected to the lower electrode layer 32r. The upper electrode layer 31r can be electrically connected to the lower electrode layer 32r via the minute particle region 20r. The minute particle region 20r is electrically connected in parallel with the magnetic tunnel junction 2r. The side wall portion 17r is included between an inner part 28r of the minute particle region 20r and the side surface 4r of the magnetic tunnel junction 2r.

Fifth Embodiment

Figure 10:
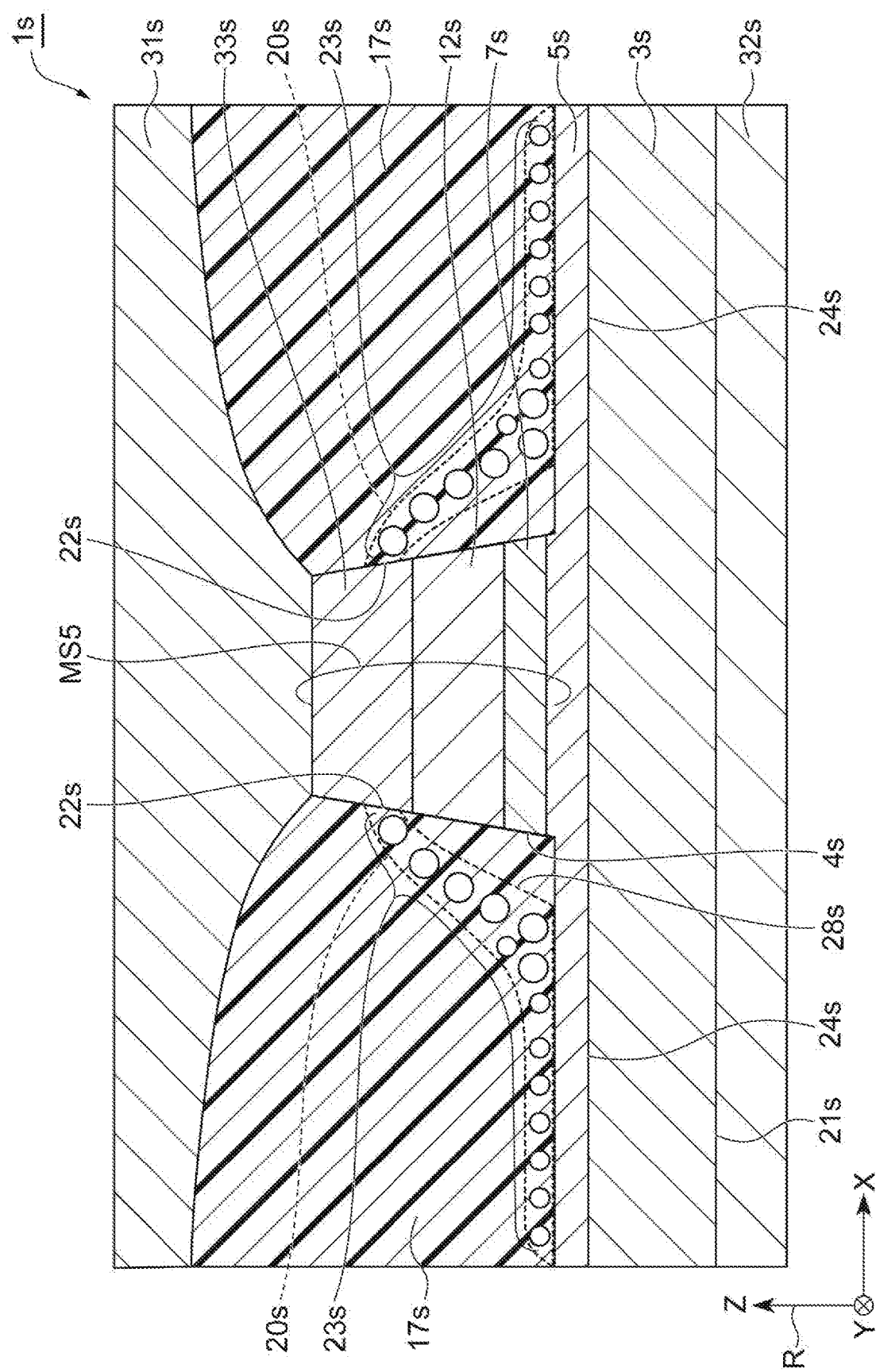
FIG. 10 is a cross-sectional view in the vicinity of a TMR element of an MRAM of a fifth embodiment.

FIG. 10 is a cross-sectional view in the vicinity of a TMR element of an MRAM of a fifth embodiment, and corresponds to FIG. 4 in the first embodiment. A TMR element Is of the fifth embodiment includes a magnetic tunnel junction (defined as 2s) and a side wall portion 17s that covers the side surface 4s of the magnetic tunnel junction 2s. For example, the magnetic tunnel junction 2s includes a reference layer 3s, a tunnel barrier layer 5s on the reference layer 3s, and a magnetization free layer 7s on the tunnel barrier layer 5s. A cap layer 12s is, for example, disposed on the magnetic tunnel junction 2s. A conductive layer 33s is, for example, further disposed on the cap layer 12s. In the fifth embodiment, a part of the tunnel barrier layer 5s, the magnetization free layer 7s, the cap layer 12s, and the conductive layer 33s constitute a mesa MS5. For example, the mesa MS5 is formed using a method such as etching, and is fabricated by performing the etching up to a position in the middle of the tunnel barrier layer 5s. For example, the mesa MS5 has an inclination such that the width of the mesa MS5 is uniformly decreased in a direction from a lower layer to an upper layer. For example, the conductive layer 33s includes a material such as Ru, Ta, TaN, or TiN. The thickness of the conductive layer 33s is, for example, 2 to 50 nm.

In the TMR element Is, an upper electrode layer 31s is, for example, disposed on the cap layer 12s and the side wall portion 17s. A base layer 21s is, for example, disposed under the reference layer 3s. A lower electrode layer 32s is, for example, disposed under the base layer 21s. The lower electrode layer 32s is, for example, electrically connected to the upper electrode layer 31s via the base layer 21s, the reference layer 3s, the tunnel barrier layer 5s, the magnetization free layer 7s, the cap layer 12s, and the conductive layer 33s. The side wall portion 17s includes an insulation material.

A minute particle region 20s is disposed in the side wall portion 17s. The minute particle region 20s has a granular structure and includes an insulation material and minute magnetic metal particles 23s that are dispersed in the insulation material. The insulation material of the minute particle region 20s is, for example, the same as the insulation material of the side wall portion 17s. The minute particle region 20s extends in the side wall portion 17s outside the mesa MS5. For example, an upper end 22s of the minute particle region 20s is in contact with the upper electrode layer 31s, and a lower end 24s of the minute particle region 20s is in contact with the tunnel barrier layer 5s that is electrically connected to the lower electrode layer 32s. Since the upper electrode layer 31s can be electrically connected to the lower electrode layer 32s via the minute particle region 20s, the minute particle region 20s is electrically connected in parallel with the magnetic tunnel junction 2s. The side wall portion 17s is included between an inner part 28s of the minute particle region 20s and the side surface 4s of the magnetic tunnel junction 2s.

Sixth Embodiment

Figure 11:
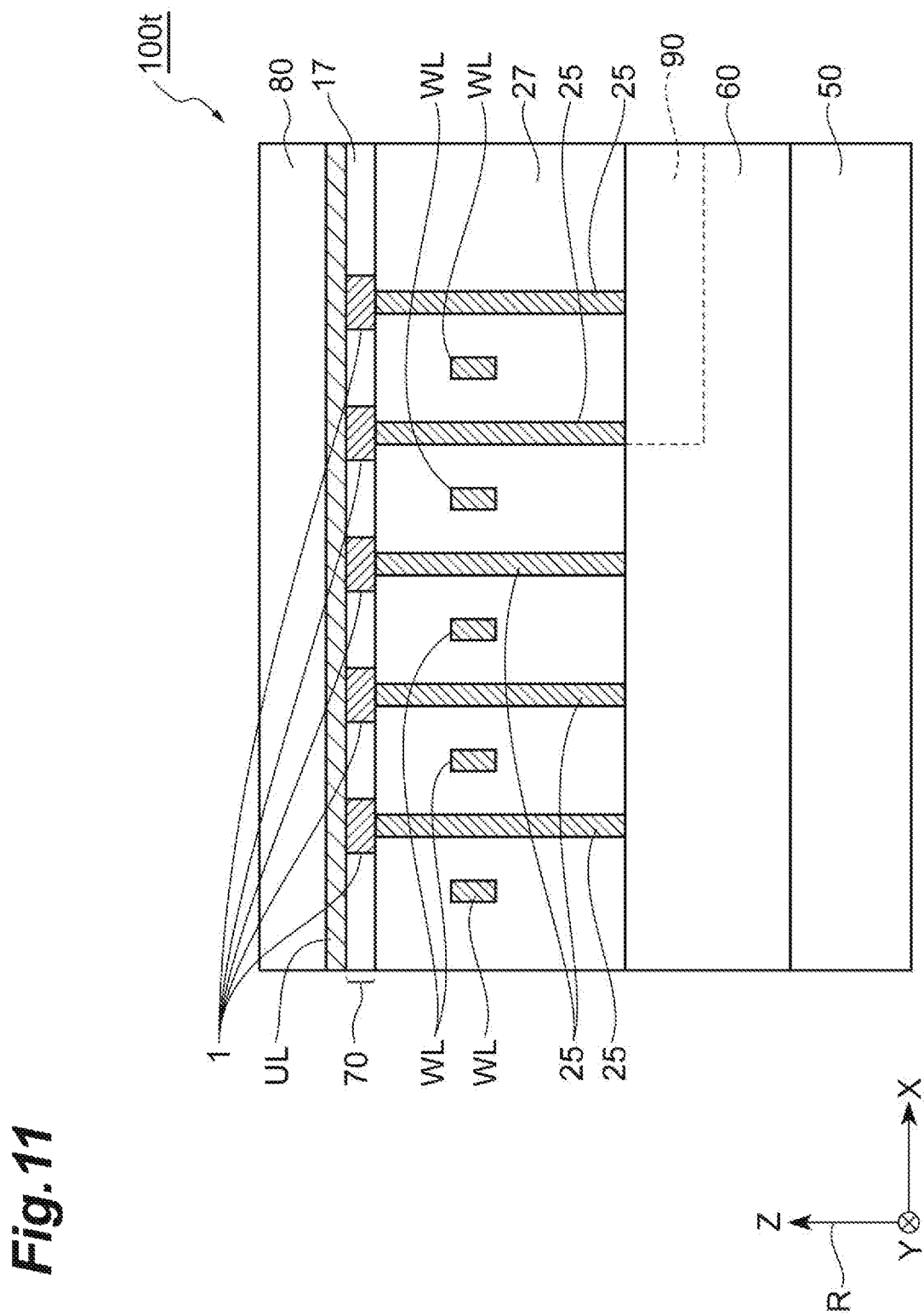
FIG. 11 is a schematic view of a vertical cross-section of an MRAM according to a sixth embodiment.

FIG. 11 is a schematic view of a vertical cross-section of an MRAM according to a sixth embodiment. An MRAM 100t according to the sixth embodiment is different from the MRAM 100 of the basic aspect of the first embodiment in that the MRAM 100t further includes a processor 90. In the MRAM 100t, an MRAM part is formed as a part of a step of forming the circuit of the processor 90. Thus, the processor 90 and the MRAM part of the MRAM 100t are integrated. Thus, the MRAM 100t is a built-in memory. Accordingly, the speed of data exchange between the processor 90 and the MRAM part is increased. The MRAM 100t can include the TMR elements illustrated in the first embodiment to the fifth embodiment.

REFERENCE SIGNS LIST

1 TMR ELEMENT
2 MAGNETIC TUNNEL JUNCTION
3 REFERENCE LAYER
4 SIDE SURFACE

5 TUNNEL BARRIER LAYER
7 MAGNETIZATION FREE LAYER
12 CAP LAYER
14 NON-MAGNETIC LAYER
16 PINNING LAYER
17 SIDE WALL PORTION
18 CONTACT LAYER
20 MINUTE PARTICLE REGION
23 MINUTE MAGNETIC METAL PARTICLE

The invention claimed is:

1. A tunnel magnetoresistive effect element comprising:
a magnetic tunnel junction;
a side wall portion covering a side surface of the magnetic tunnel junction; and
a minute particle region disposed in the side wall portion,
wherein the side wall portion includes an insulation material,
the minute particle region includes the insulation material and a plurality of minute magnetic metal particles dispersed in the insulation material, and
the minute particle region is electrically connected in parallel with the magnetic tunnel junction.

2. The tunnel magnetoresistive effect element according to claim 1,
wherein a thickness of the minute particle region is greater than or equal to 0.2 nm and less than or equal to 50 nm.

3. The tunnel magnetoresistive effect element according to claim 1,
wherein a distance between one minute magnetic metal particle and another minute magnetic metal particle is greater than or equal to 0.2 nm and less than or equal to 10 nm.

4. The tunnel magnetoresistive effect element according to claim 1,
wherein a particle diameter of the minute magnetic metal particle is greater than or equal to 0.2 nm and less than or equal to 10 nm.

5. The tunnel magnetoresistive effect element according to claim 1,
wherein the minute magnetic metal particle includes at least one chemical element selected from the group consisting of Fe, Co, and Ni.

6. The tunnel magnetoresistive effect element according to claim 1,
wherein the magnetic tunnel junction includes a reference layer, a tunnel barrier layer stacked on the reference layer, and a magnetization free layer stacked on the tunnel barrier layer.

7. The tunnel magnetoresistive effect element according to claim 6,
wherein an area of the magnetization free layer is smaller than an area of the tunnel barrier layer.

8. The tunnel magnetoresistive effect element according to claim 6, further comprising:
a non-magnetic layer disposed under the reference layer of the magnetic tunnel junction;
a pinning layer disposed under the non-magnetic layer; and
a contact layer disposed under the pinning layer,
wherein the reference layer forms antiferromagnetic coupling with the pinning layer via the non-magnetic layer, and
an area of the magnetization free layer is smaller than an area of the contact layer.

9. The tunnel magnetoresistive effect element according to claim 2,
wherein a distance between one minute magnetic metal particle and another minute magnetic metal particle is greater than or equal to 0.2 nm and less than or equal to 10 nm.

10. The tunnel magnetoresistive effect element according claim 2, wherein a particle diameter of the minute magnetic metal particle is greater than or equal to 0.2 nm and less than or equal to 10 nm.

11. The tunnel magnetoresistive effect element according claim 3,
wherein a particle diameter of the minute magnetic metal particle is greater than or equal to 0.2 nm and less than or equal to 10 nm.

12. The tunnel magnetoresistive effect element according to claim 2,
wherein the minute magnetic metal particle includes at least one chemical element selected from the group consisting of Fe, Co, and Ni.

13. The tunnel magnetoresistive effect element according to claim 3,
wherein the minute magnetic metal particle includes at least one chemical element selected from the group consisting of Fe, Co, and Ni.

14. The tunnel magnetoresistive effect element according to claim 2,
wherein the magnetic tunnel junction includes a reference layer, a tunnel barrier layer stacked on the reference layer, and a magnetization free layer stacked on the tunnel barrier layer.

15. The tunnel magnetoresistive effect element according to claim 3,
wherein the magnetic tunnel junction includes a reference layer, a tunnel barrier layer stacked on the reference layer, and a magnetization free layer stacked on the tunnel barrier layer.

16. The tunnel magnetoresistive effect element according to claim 14,
wherein an area of the magnetization free layer is smaller than an area of the tunnel barrier layer.

17. The tunnel magnetoresistive effect element according to claim 14, further comprising:
a non-magnetic layer disposed under the reference layer of the magnetic tunnel junction;
a pinning layer disposed under the non-magnetic layer; and
a contact layer disposed under the pinning layer,
wherein the reference layer forms antiferromagnetic coupling with the pinning layer via the non-magnetic layer, and
an area of the magnetization free layer is smaller than an area of the contact layer.

18. A magnetic memory comprising:
the tunnel magnetoresistive effect element according to claim 1, as a storage element.

19. A magnetic memory comprising:
the tunnel magnetoresistive effect element according to claim 2, as a storage element.

20. A built-in memory comprising:
the magnetic memory according to claim 18.

* * * * *